US008570689B2

(12) United States Patent
Sato et al.

(10) Patent No.: US 8,570,689 B2
(45) Date of Patent: Oct. 29, 2013

(54) DIFFERENTIAL MAGNETORESISTIVE EFFECT HEAD AND MAGNETIC RECORDING/READING DEVICE

(75) Inventors: Yo Sato, Kanagawa (JP); Katsumi Hoshino, Kanagawa (JP); Masato Shiimoto, Kanagawa (JP); Takeshi Nakagawa, Ibaraki (JP); Hiroyuki Hoshiya, Kanagawa (JP)

(73) Assignee: HGST Netherlands B.V., Amsterdam (NL)

( * ) Notice: Subject to any disclaimer, the term of this patent is extended or adjusted under 35 U.S.C. 154(b) by 517 days.

(21) Appl. No.: 12/628,577

(22) Filed: Dec. 1, 2009

(65) Prior Publication Data

US 2010/0142101 A1    Jun. 10, 2010

(30) Foreign Application Priority Data

Dec. 9, 2008 (JP) .................... 2008-313546

(51) Int. Cl.
*G11B 5/33* (2006.01)
*G11B 5/127* (2006.01)

(52) U.S. Cl.
USPC .................. 360/314; 361/324.11

(58) Field of Classification Search
USPC ............. 360/314, 324.1, 324.11
See application file for complete search history.

(56) References Cited

U.S. PATENT DOCUMENTS

| 5,701,222 A * | 12/1997 | Gill et al. ............... 360/314 |
| 6,549,382 B1 * | 4/2003 | Gill ................. 360/324.11 |
| 6,657,823 B2 | 12/2003 | Kawato ................. 360/314 |
| 6,693,776 B2 * | 2/2004 | Gill ................. 360/324.12 |
| 6,927,948 B2 | 8/2005 | Gill ...................... 360/314 |
| 2001/0028537 A1 * | 10/2001 | Gill ...................... 360/314 |
| 2002/0075608 A1 * | 6/2002 | Kawato ................. 360/314 |
| 2002/0126426 A1 * | 9/2002 | Gill ................. 360/324.12 |
| 2003/0123198 A1 * | 7/2003 | Sugawara et al. ....... 360/314 |
| 2003/0184918 A1 * | 10/2003 | Lin et al. ............... 360/314 |
| 2004/0075953 A1 * | 4/2004 | Gill ...................... 360/314 |
| 2004/0145835 A1 * | 7/2004 | Gill ...................... 360/314 |
| 2006/0044706 A1 * | 3/2006 | Gill ................. 360/324.12 |
| 2007/0297102 A1 * | 12/2007 | Gill ................. 360/324.11 |
| 2009/0059437 A1 * | 3/2009 | Gill et al. ............... 360/314 |

FOREIGN PATENT DOCUMENTS

| JP | 2002/183915 | 6/2002 |
| JP | 2003/069109 | 3/2003 |
| JP | 2004/227749 | 8/2004 |
| JP | 2008/085219 | 4/2008 |

\* cited by examiner

*Primary Examiner* — Wayne Young
*Assistant Examiner* — Adam B Dravininkas
(74) *Attorney, Agent, or Firm* — Zilka-Kotab, PC

(57) ABSTRACT

According to one embodiment, a differential magnetoresistive effect element comprises a first magnetoresistive effect element having a first pinning layer, a first intermediate layer, and a first free layer. The differential magnetoresistive effect element also comprises a second magnetoresistive effect element stacked via a spacer layer above the first magnetoresistive effect element, the second magnetoresistive effect element having a second pinning layer, a second intermediate layer, and a second free layer. The first magnetoresistive effect element and the second magnetoresistive effect element show in-opposite-phase resistance change in response to a magnetic field in the same direction, and $tp2 > tp1$ is satisfied when a thickness of the first pinning layer is $tp1$, and a thickness of the second pinning layer is $tp2$. In another embodiment, the first and second magnetoresistive effect elements may be CPP-GMR elements. Other elements, heads, and magnetic recording/reading devices are described according to other embodiments.

18 Claims, 9 Drawing Sheets

(a)

(b)

DIFFERENTIAL MAGNETORESISTIVE EFFECT HEAD AND MAGNETIC RECORDING/READING DEVICE

RELATED APPLICATIONS

The present application claims priority to a Japanese Patent Application filed Dec. 9, 2008, under Appl. No. 2008-313546, which is incorporated herein by reference.

FIELD OF THE INVENTION

The present invention relates to high magnetic recording density, and more specifically, to a magnetoresistive effect element, a magnetic head, and a magnetic recording/reading device to achieve high magnetic recording density.

BACKGROUND OF THE INVENTION

Recently, computerization of information and increases in capacity of web content have advanced with extensive use of Internet and a rapid increase in communication speeds. Accordingly, electronic information storage demands have now increased throughout the world. To enable recording of large amounts of data, use of magnetic recording/reading devices, such as a hard disk drive (HDD), has increased rapidly along with demands for increased recording density, and a magnetic head or a magnetic medium which enables high recording density. In recent years, a magnetoresistive effect head has been mounted as a reproduction element in a magnetic recording/reading device, and a structure called spin valve has been used for the head, which utilizes a magnetoresistive effect of a multilayer film formed by stacking a ferromagnetic metal layer and a nonmagnetic layer. The magnetoresistive effect refers to a phenomenon where electric resistance is changed depending on an angle formed by magnetizations of two ferromagnetic layers with a nonmagnetic intermediate layer between them. The spin valve using the magnetoresistive effect has a structure of antiferromagnetic layer/ferromagnetic layer/nonmagnetic intermediate layer/ferromagnetic layer, and produces output by allowing magnetization of the ferromagnetic layer contacted to the antiferromagnetic layer to be substantially pinned by an exchange coupling magnetic field generated at an interface between the antiferromagnetic layer and the ferromagnetic layer, and magnetization of another ferromagnetic layer to be freely rotated by an external magnetic field. The ferromagnetic layer of which the magnetization is substantially pinned by the antiferromagnetic layer is called the pinning layer, and the ferromagnetic layer of which the magnetization is rotated by an external magnetic field is called the free layer.

In the past, a CIP (Current-In-Plane)-GMR (Giant Magnetoresistive) head has been used for the spin valve utilizing the magnetoresistive effect, which is used by flowing current in an in-plane direction of a stacked film. Recently, heads have been increasingly utilizing Tunneling Magnetoresistive (TMR) heads or CPP (Current-Perpendicular-to-Plane)-GMR heads, which are used by flowing current in a thickness direction of a stacked film.

There are two major reasons why the CIP-GMR head has been increasingly replaced with the TMR head or the CPP-GMR head in current head designs. First, since the TMR head or the CPP-GMR head can have increased reading output compared with the CIP-GMR head, a high SNR (output/noise ratio) may be achieved therein. Second, the CPP method in which current is flowed in a perpendicular direction of a stacked film is advantageous in improving linear recording density compared with the CIP method in which current is flowed in an in-plane direction of the stacked film. The linear recording density means bit density in a circumferential direction of a magnetic recording medium. Bit density in a radial direction of the medium is called track density. Both bit densities may be increased, thereby areal density of a magnetic recording/reading device is improved. Accordingly, reading resolution must be improved to increase linear recording density as an increased bit density is not helpful if a reader cannot read the bits. The reading resolution is an index showing what level of reading output can be kept during high density recording compared with during low density recording.

Currently, a magnetoresistive effect head is configured such that a magnetoresistive effect film is interposed between a lower magnetic shield and an upper magnetic shield, and reading resolution in a linear recording density direction greatly depends on an interval between the upper and lower magnetic shields. That is, as the interval between the upper and lower magnetic shields is reduced, the resolution in the linear recording density direction is increased, and high areal density may be more easily achieved. In the previous CIP-GMR head, the magnetoresistive effect film was electrically isolated from each of the upper and lower magnetic shields. Therefore, an insulating film was inserted between the magnetoresistive effect film and each of the upper and lower magnetic shields, and the interval between the upper and lower magnetic shields was difficult to reduce. On the other hand, a TMR head or a CPP-GMR head, in which current is flowed in a perpendicular direction of a stacked film, has an advantage in that the interval between the upper and lower magnetic shields may be reduced because the insulating film needs not be inserted between the magnetoresistive effect film and each of the upper and lower magnetic shields. In this way, the magnetoresistive effect head may be shifted from the CIP-GMR head to the TMR head or the CPP-GMR head with a goal of achieving higher output and improved reading resolution.

However, current CPP magnetoresistive effect films are generally extremely difficult to maintain thicknesses of less than about 25 nm because the film has a multilayer structure, and each layer has a minimum thickness necessary for keeping a magnetic property of the layer. Therefore, improvement in reading resolution may reach a limit in the near future based on the layer's minimum thickness. Accordingly, the interval between the upper and lower magnetic shields cannot be reduced to less than about 25 nm in a read head having the existing structure, which is a significant obstruction to achieving high areal density.

Thus, a differential read head has been proposed for improving resolution in the linear recording density direction. In the in-plane magnetic recording method, a signal magnetic field is generated from a recording bit only in a magnetization reversal region in recording bits written into a magnetic recording medium. On the other hand, in the perpendicular magnetic recording method, a signal magnetic field is always generated from each recording bit. Therefore, the perpendicular magnetic recording method is convenient for using the differential read head.

Japanese Patent Office (JPO) Pub. No. JP-A-2002-183915 discloses a read head structure of a magnetic recording/reading device using the perpendicular magnetic recording method, in which a pair of magnetoresistive effect films are connected in series via a conductive layer for differential operation. In the pair of magnetoresistive effect films, two free layers to be magnetosensitive portions to a signal magnetic field are disposed to be adjacently opposed to each other via a conductive layer. In addition, the pair of magnetoresistive effect films are set to have resistance change characteristics having reversed polarities in response to a magnetic field in the same direction. Thus, differential operation is enabled. In this case, resolution in the linear recording density direction is greatly affected by an inside distance between the free layers rather than an interval between the upper and lower magnetic shields. Therefore, even if the interval cannot be reduced, a thickness of the conductive layer inserted between the pair of magnetoresistive effect films may be decreased, thereby allowing for a high resolution in the linear recording density direction.

Furthermore, JPO Pub. No. JP-A-2003-69109 discloses a more detailed structure of a differential read head, in which two free layers may show resistance change characteristics having reversed polarities in response to a magnetic field in the same direction.

Also, JPO Pub. No. JP-A-2008-85219 discloses a structure of a differential read head, in which one of the pair of magnetoresistive effect films shows negative magnetic resistance. In addition, it describes a configuration where a free layer is thinner, thereby use efficiency of a magnetoresistive effect film on a low output side is improved so that outputs of the films are effectively the same. However, if the free layer is thinner, since unidirectional anisotropy in the free layer due to magnetic domain control is also enhanced, an effect of improving sensitivity to a medium magnetic field is obtained, but two correlative parameters of a free layer and magnetic domain control need to be controlled, leading to difficulty in designing a head which works properly.

JPO Pub. No. JP-A-2004-227749 discloses a structure of a read head, in which high resolution is achieved even if the upper and lower magnetic shields are not provided.

However, none of these references disclose heads which can achieve the high areal density sought by current recording/reading applications, and therefore, a read head which is capable of achieving improved reading resolution which avoids the problems described previously would be greatly beneficial to increasing the areal density possible with magnetic recording/reading heads.

SUMMARY OF THE INVENTION

In one embodiment, a differential magnetoresistive effect element comprises a first magnetoresistive effect element having a first pinning layer, a first intermediate layer, and a first free layer. The differential magnetoresistive effect element also comprises a second magnetoresistive effect element stacked via a spacer layer above the first magnetoresistive effect element, the second magnetoresistive effect element having a second pinning layer, a second intermediate layer, and a second free layer. The first magnetoresistive effect element and the second magnetoresistive effect element show in-opposite-phase resistance change in response to a magnetic field in the same direction, and $tp2>tp1$ is satisfied when a thickness of the first pinning layer is $tp1$, and a thickness of the second pinning layer is $tp2$.

According to another embodiment, a differential magnetoresistive effect element comprises a first magnetoresistive effect element having a first pinning layer, a first intermediate layer, and a first free layer. The differential magnetoresistive effect element also comprises a second magnetoresistive effect element stacked via a spacer layer above the first magnetoresistive effect element, the second magnetoresistive effect element having a second pinning layer, a second intermediate layer, and a second free layer. The first magnetoresistive effect element and the second magnetoresistive effect element show in-opposite-phase resistance change in response to a magnetic field in the same direction, and $ti2<ti1$ when a thickness of the first intermediate layer is $ti1$, and a thickness of the second intermediate layer is $ti2$.

In yet another embodiment, a magnetic recording reading device comprises a magnetic recording medium, a medium drive section that drives the magnetic recording medium, a magnetic head. The magnetic head comprises a recording head, a head drive section that positions the magnetic head onto a desired track of the magnetic recording medium, and a read head. The read head includes a differential magnetoresistive effect element, the differential magnetoresistive effect element comprises a first magnetoresistive effect element having a first pinning layer, a first intermediate layer, and a first free layer. The differential magnetoresistive effect element also comprises a second magnetoresistive effect element stacked via a spacer layer above the first magnetoresistive effect element, the second magnetoresistive effect element having a second pinning layer, a second intermediate layer, and a second free layer. The first magnetoresistive effect element and the second magnetoresistive effect element show in-opposite-phase resistance change in response to a magnetic field in the same direction, and $tp2>tp1$ is satisfied when a thickness of the first pinning layer is $tp1$, and a thickness of the second pinning layer is $tp2$.

Any of these embodiments may be implemented in a magnetic data storage system such as a disk drive system, which may include a magnetic head, a drive mechanism for passing a magnetic medium (e.g., hard disk) over the magnetic head, and a controller electrically coupled to the magnetic head.

Other aspects and advantages of the present invention will become apparent from the following detailed description, which, when taken in conjunction with the drawings, illustrate by way of example the principles of the invention.

DETAILED DESCRIPTION

Figure 1:
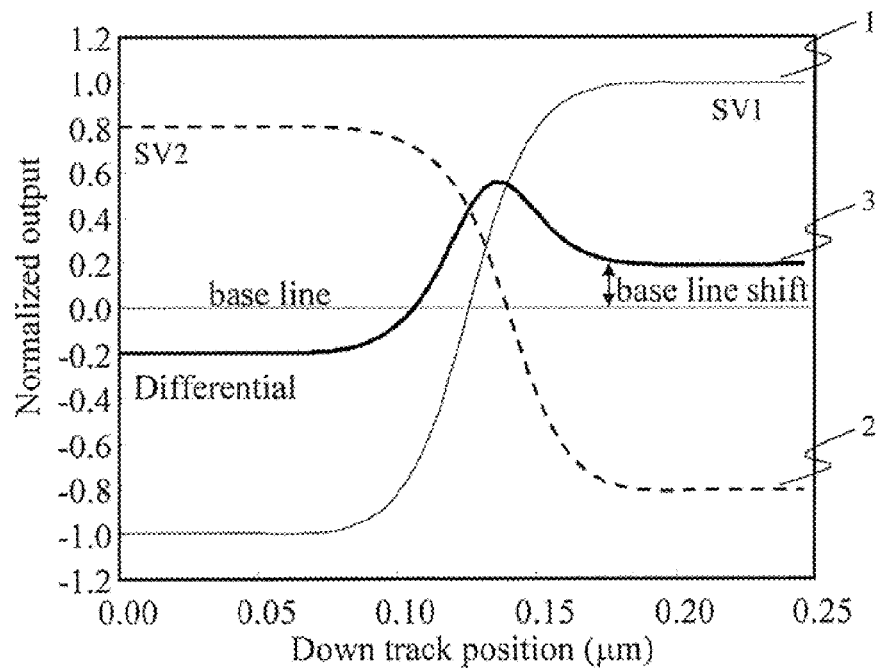
FIG. 1 is a diagram showing output waveforms of respective magnetoresistive effect elements which comprise a differential magnetoresistive effect element according to one embodiment, and a synthesized output waveform of the differential magnetoresistive effect element.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

In one general embodiment, a differential magnetoresistive effect element comprises a first magnetoresistive effect element having a first pinning layer, a first intermediate layer, and a first free layer. The differential magnetoresistive effect element also comprises a second magnetoresistive effect element stacked via a spacer layer above the first magnetoresistive effect element, the second magnetoresistive effect element having a second pinning layer, a second intermediate layer, and a second free layer. The first magnetoresistive effect element and the second magnetoresistive effect element show in-opposite-phase resistance change in response to a magnetic field in the same direction, and tp2>tp1 is satisfied when a thickness of the first pinning layer is tp1, and a thickness of the second pinning layer is tp2.

In another general embodiment, a differential magnetoresistive effect element comprises a first magnetoresistive effect element having a first pinning layer, a first intermediate layer, and a first free layer. The differential magnetoresistive effect element also comprises a second magnetoresistive effect element stacked via a spacer layer above the first magnetoresistive effect element, the second magnetoresistive effect element having a second pinning layer, a second intermediate layer, and a second free layer. The first magnetoresistive effect element and the second magnetoresistive effect element show in-opposite-phase resistance change in response to a magnetic field in the same direction, and ti2<ti1 when a thickness of the first intermediate layer is ti1, and a thickness of the second intermediate layer is ti2.

In another general embodiment, a magnetic recording reading device comprises a magnetic recording medium, a medium drive section that drives the magnetic recording medium, and a magnetic head. The magnetic head comprises a recording head, a head drive section that positions the magnetic head onto a desired track of the magnetic recording medium, and a read head. The read head includes a differential magnetoresistive effect element, the differential magnetoresistive effect element comprises a first magnetoresistive effect element having a first pinning layer, a first intermediate layer, and a first free layer. The differential magnetoresistive effect element also comprises a second magnetoresistive effect element stacked via a spacer layer above the first magnetoresistive effect element, the second magnetoresistive effect element having a second pinning layer, a second intermediate layer, and a second free layer. The first magnetoresistive effect element and the second magnetoresistive effect element show in-opposite-phase resistance change in response to a magnetic field in the same direction, and tp2>tp1 is satisfied when a thickness of the first pinning layer is tp1, and a thickness of the second pinning layer is tp2.

Differential read heads generally have a problem where if a difference exists between outputs of two magnetoresistive effect elements, baseline shift occurs in a reading waveform. FIG. 1 shows a synthesized output waveform 3 where an output waveform 2 of one magnetoresistive effect element is small compared with an output waveform 1 of the other magnetoresistive effect element. The baseline shift refers to a phenomenon where when an in-phase medium magnetic field is applied to the two magnetoresistive effect elements, output as a base (baseline) is shifted to a larger or smaller output side depending on a polarity of the medium magnetic field. It is known from a recent study that the baseline shift does not affect reading output, resolution, and SNR, but instead degrades a bit error rate. Therefore, according to one embodiment, the differential head may be designed such that outputs of the two magnetoresistive effect elements are approximately equal to each other in order to alleviate this problem.

Figure 2:
FIG. 2 is a view showing a cross-sectional TEM image of a produced differential magnetoresistive effect element, according to one embodiment.

However, a differential magnetoresistive effect element, in which two magnetoresistive effect elements are stacked in a thickness direction, has a problem that when a first magnetoresistive effect element and a second magnetoresistive effect element are formed in order from a substrate side, crystallinity and flatness of the second element are degraded. FIG. 2 shows a cross-sectional TEM photograph of an actual element that was produced via experimentation. As can be seen in FIG. 2, flatness of an interface of the second magnetoresistive effect element is obviously degraded compared with that of the first magnetoresistive effect element. This is due to influence of fluctuation in crystal growth caused by accuracy of a deposition apparatus or variation in crystal grain size or crystal orientation. Such degradation in crystallinity and flatness becomes more significant with an increase in deposition thickness. Therefore, in the differential magnetoresistive effect element formed by stacking two magnetoresistive effect elements, crystallinity and flatness of the second magnetoresistive effect element are inevitably degraded compared with flatness of the first magnetoresistive effect element. Therefore, when a pair of magnetoresistive effect elements having the same thickness are simply stacked, output of the second magnetoresistive effect element is low compared with output of the first magnetoresistive effect element. As a result, baseline shift occurs. This problem is corrected in heads presented herein, according to some embodiments.

A differential magnetoresistive effect element, according to one embodiment, has a stacked structure where a second spin-valve-type magnetoresistive effect element is stacked on a first spin-valve type magnetoresistive effect element via a spacer layer, and performs differential operation by allowing the first and second magnetoresistive effect elements to show in-opposite-phase resistance change in response to a magnetic field in the same direction. The first spin-valve-type magnetoresistive effect element is configured of a first pinning layer, a first intermediate layer, and a first free layer, and the second spin-valve-type magnetoresistive effect element is configured of a second pinning layer, a second intermediate layer, and a second free layer. When it is assumed that thickness of the first pinning layer is tp1, and thickness of the second pinning layer is tp2, tp2 is larger than tp1. Alternatively, when it is assumed that thickness of the first intermediate layer is ti1, and thickness of the second intermediate layer is ti2, ti2 is smaller than ti1.

According to some approaches, the thickness tp2 of the second pinning layer may be made large compared with the thickness tp1 of the first pinning layer, thereby resulting in a spin-dependent bulk scattering effect of tp2 being increased, and a resistance change rate of the second spin-valve-type magnetoresistive effect element is increased. Thus, resistance change of the first spin-valve-type magnetoresistive effect element can be made equal to that of the second spin-valve-type magnetoresistive effect element.

Alternatively, according to some approaches, the thickness ti2 of the second intermediate layer may be made small compared with the thickness ti1 of the first intermediate layer, which decreases the probability that a spin polarization electron flowing through an intermediate layer is inelastically scattered in the intermediate layer, resulting in loss of spin information, and a resistance change rate of the second spin-valve-type magnetoresistive effect element is increased. Thus, resistance change of the first spin-valve-type magnetoresistive effect element can be made substantially equal to that of the second spin-valve-type magnetoresistive effect element.

According to the above, a differential magnetoresistive effect element, in which baseline shift does not occur, can be achieved.

Moreover, a read head using the differential magnetoresistive effect element may be combined with an induction-type thin-film magnetic head or a perpendicular recording head, thereby creating a magnetic head with an increased areal density. Furthermore, a magnetic recording/reading device mounted with the magnetic head may be created with an outstanding recording/reading bias characteristic.

Hereinafter, the invention will be described more specifically according to several examples with reference to the figures, according to several embodiments.

Thickness in each example refers to thickness obtained from a deposition rate of each layer. The thickness corresponds to a thickness evaluated by defining a surface corresponding to a middle value of roughness of an interface between adjacent layers in a cross-sectional TEM image as an interface between the layers. Since a deposition rate is controlled to be about 0.1 nm/sec regardless of the material used, even if variation due to device control is taken into consideration, variation in thickness due to a device is less than about 0.2 nm.

Figure 3:
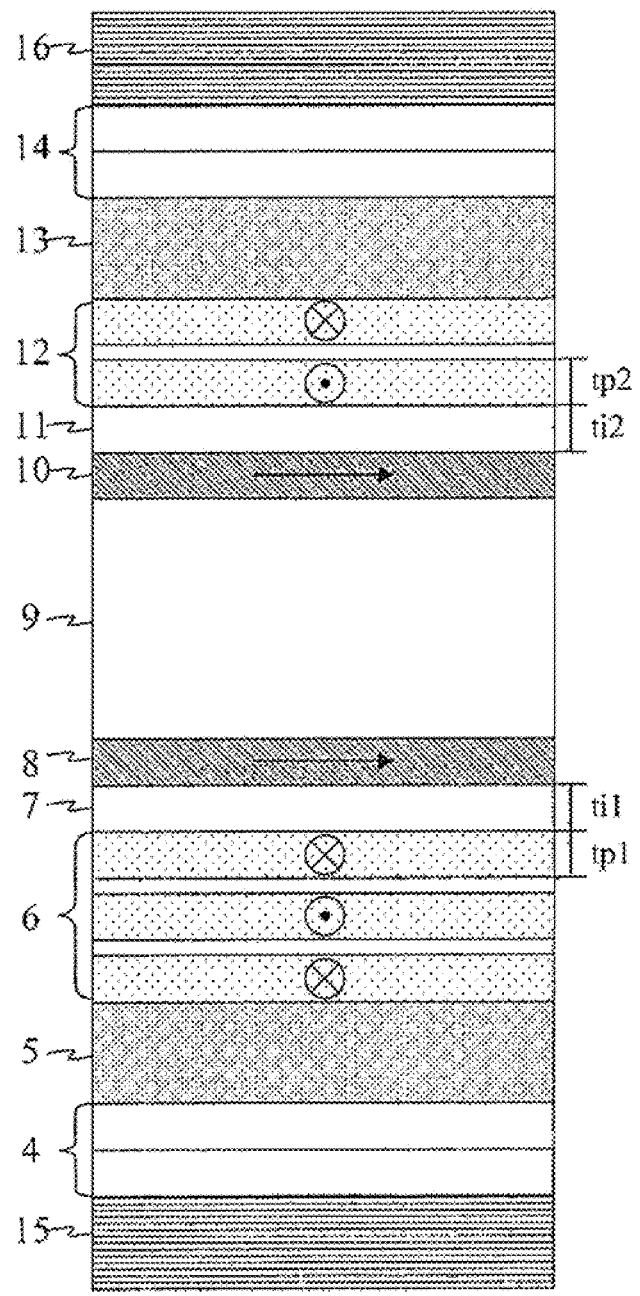
FIG. 3 is a schematic view as seen from an ABS side of a differential magnetoresistive effect element, according to one embodiment.

FIG. 3 is a schematic view of a differential magnetoresistive effect element, according to one embodiment, when viewed from an air bearing surface (ABS) side.

Specifically, a first underlayer 4, a first anti ferromagnetic layer 5, a first pinning layer 6, a first intermediate layer 7, a first free layer 8, a spacer layer 9, a second free layer 10, a second intermediate layer 11, a second pinning layer 12, a second antiferromagnetic layer 13, a cap 14, and an upper shield 16 are formed on a lower shield 15. The first underlayer 4 is may control crystal orientation of a film formed thereon, and a Ta (3 nm)/Ru (2 nm) multilayer film may be used for the underlayer, such as was done in the example. In addition, a single-layer film of Al, Cu, Cr, Fe, Nb, Hf, Ni, Ta, Ru, NiFe, NiCr, NiFeCr, etc., or a multilayer film including such a material may be used. While MnIr was used for the first antiferromagnetic layer 5 and the second antiferromagnetic layer 13 in the example, an antiferromagnetic material such as MnIrCr, MnPt, etc., may also be used.

For the first pinning layer 6 and the second pinning layer 12, while a single ferromagnetic layer may be used, a stacked ferromagnetic configuration may preferably be used, according to some approaches, in order to improve external magnetic field resistance of the pinning layer. The stacked ferromagnetic configuration is a configuration where two ferromagnetic layers are magnetically coupled to each other in an antiparallel manner via a nonmagnetic layer, and may have a configuration including a ferromagnetic layer/nonmagnetic layer/ferromagnetic layer. For the ferromagnetic layer, an alloy including CoFe, NiFe, etc., may be used as a base, or a Heusler alloy may be used. When using a Heusler alloy, a multilayer structure may be used to control counter diffusion in the interface and crystal orientation of the interface, in which a material including CoFe, NiFe, etc., is used as a base and is inserted into an interface between the Heusler alloy and another layer. To cause negative-phase resistance change in response to an in-phase external magnetic field, one of the first pinning layer 6 and the second pinning layer 12 may have an even number of stacked ferromagnetic layers, and the other may have an odd number of stacked ferromagnetic layers. However, since the pinning layer varies more easily in response to an external magnetic field with an increase in number of stacked layers, the number may be preferably about two to five layers, but is not so limited. In the stacked ferromagnetic configuration according to the example, CoFe (3 nm)/Ru (0.8 nm)/CoFe (6 nm)/Ru (0.8 nm)/CoMnGe (x nm, where x is a variable) was used from a lower side of a stacking order for the first pinning layer 6, and CoMnGe (y nm, where y is a variable)/Ru (0.8 nm)/CoFe (3 nm) was used from a lower side of a stacking order for the second pinning layer 12. Each numerical value in the parenthesis shows a thickness of the layer. Cu (2.5 nm) was used for the first intermediate layer 7 and the second intermediate layer 11. Au, Ag, Cr and the like may also be used as a material for the intermediate layer.

CoMnGe (3 nm) was used for the first free layer 8 and the second free layer 10. A free layer having a multilayer structure including Heusler alloy, a free layer including an alloy including CoFe, NiFe, etc., and a free layer having a stacked ferromagnetic configuration may also be used as the free layer.

In the example, Ru (15 nm) was used for the spacer layer 9. An optimum thickness value may be selected according to a grain size of a medium, and a thickness of about 1 nm to about 30 nm may be used as a thickness of the spacer layer 9. In addition, as a specific configuration of the spacer layer 9, Cr, Cu, Pd, Ag, Ir, Pt, Au, Mo, Ru, Rh, Ta, W, Pr, Nd, Sm, Eu, Gd, Tb, Dy, Ho, Er, etc., may also be used. Alternatively, an alloy or a multilayer structure including any of these elements may also be used. A material which has low resistance and minimally affects crystallinity of the second magnetoresistive effect element may be preferably selected from the elements.

The configuration shown in the example has a characteristic that when recording density is improved and grain size of a medium is accordingly reduced, the configuration can easily provide a high recording density by reducing a thickness of the spacer layer 9, in some approaches.

Figure 4:
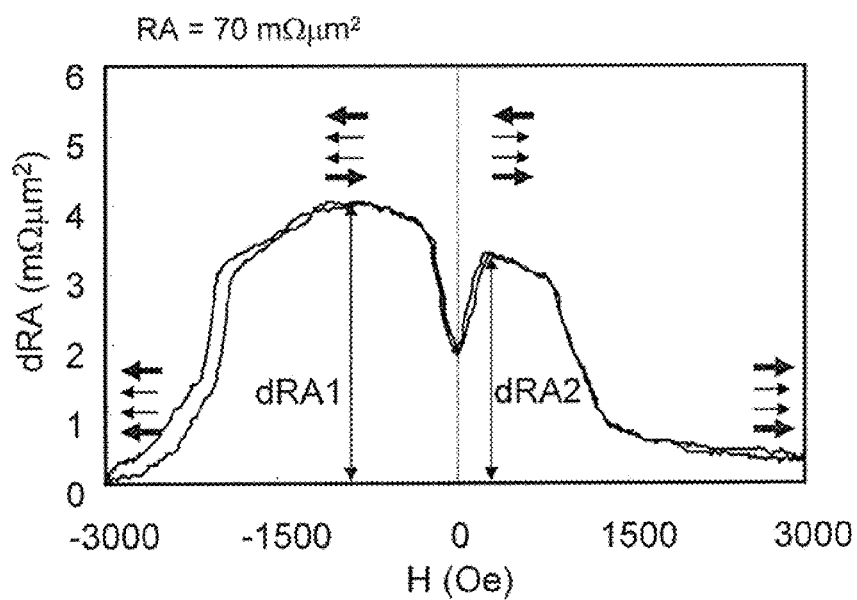
FIG. 4 is a diagram showing a relationship between change in resistance area product dRA of the differential magnetoresistive effect element and an external magnetic field, according to one embodiment.

FIG. 4 shows a relationship between a change in resistance area product dRA of a produced differential magnetoresistive effect element and an external magnetic field H, according to one embodiment. When it is assumed that a change in resistance area product of the first magnetoresistive effect element is dRA1, and a change in resistance area product of the second magnetoresistive effect element is dRA2, a situation where the external magnetic field H is negative and a resistance area product is largest corresponds to a condition where the free layer and the pinning layer of the first magnetoresistive effect element are antiparallel to each other, and the free layer and the pinning layer of the second magnetoresistive effect element are parallel to each other. Therefore, when the external magnetic field H is negative, a difference between the minimum value of resistance and the maximum value thereof corresponds to dRA1. A situation where the external magnetic field H is positive and a resistance area product is largest corresponds to a condition where the free layer and the pinning layer of the first magnetoresistive effect element are parallel to each other, and the free layer and the pinning layer of the second magnetoresistive effect element are antiparallel to each other. Therefore, when the external magnetic field H is positive, a difference between the minimum value and the maximum value of resistance corresponds to dRA2. dRA 1 and dRA2 can be estimated according to the above evaluation.

Figure 5:
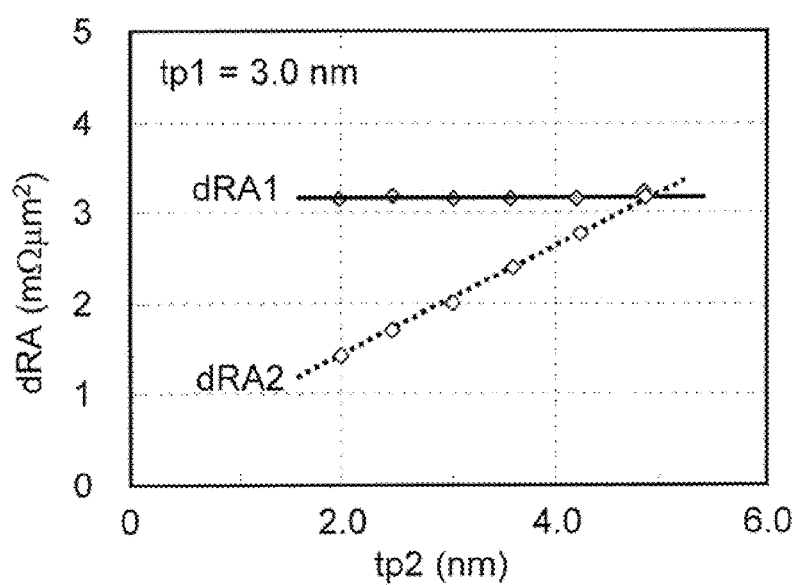
FIG. 5 is a diagram showing $tp2$ dependence of $dRA2$, according to one embodiment.

FIG. 5 shows dRA1 and dRA2 in a situation where the thickness tp1 of the first pinning layer 6 is 3 nm, and the thickness tp2 of the second pinning layer 12 is plotted in abscissa. When the pinning layer has a stacked ferromagnetic configuration and includes several layers, tp1 refers to a total thickness of continuous ferromagnetic layers adjacent to the first intermediate layer 7 among ferromagnetic layers forming the first pinning layer 6, and tp2 refers to a total thickness of continuous ferromagnetic layers adjacent to the second intermediate layer 11 among ferromagnetic layers forming the second pinning layer 12.

From FIG. 5, when tp1=tp2=3 nm, a difference between dRA1 and dRA2 is 1.2 mΩm². This corresponds to a reduction in output due to degradation in crystallinity of the second magnetoresistive effect element. When the thickness tp2 is gradually increased, only dRA2 is increased, and dRA1 is not affected. It is known from this that the thickness tp2 is controlled, and thereby dRA2 can be controlled independently of dRA1. When tp1 is 3 nm, dRA1=dRA2 is established in the situation where tp2 is 5 nm, that is, tp2-tp1=2 nm.

Figure 6:
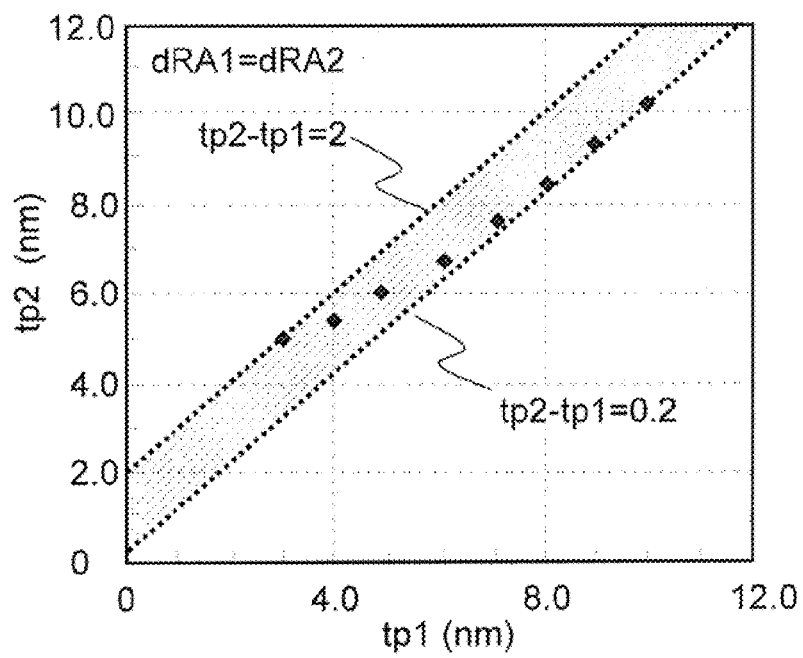
FIG. 6 is a diagram showing a combination of $tp1$ and $tp2$, where $dRA1=dRA2$, according to one embodiment.

Next, FIG. 6 shows a thickness tp2 at which dRA1=dRA2 is established when thickness tp1 is in a range of about 3 nm to about 10 nm. It can be seen in the figure that the thickness tp2 at which dRA1=dRA2 is within a range of 2.0 nm≥tp2-tp1≥0.2 nm. Here, the lower limit of tp1, 3 nm, is a lower limit of thickness above which output of a magnetoresistive effect element is sufficiently secured, according to some approaches. Typically, in a CPP-type magnetoresistive effect element, a spin bulk scattering effect is increased with an increase in thickness of a magnetic layer, and therefore output is increased until the thickness is increased to a certain level. However, if thickness of the first pinning layer 6 is too large, pinning force of the pinning layer caused by the antiferromagnetic layer and the stacked ferromagnetic structure is reduced, so that magnetization in the pinning layer is easily moved in response to an external magnetic field. Therefore, an upper limit of tp1 of about 10 nm is preferable.

In the example, ti1=ti2=2.5 nm was used for the first intermediate layer 7 (thickness ti1) and the second intermediate layer 11 (thickness ti2). However, when the thickness ti1 and the thickness ti2 are changed respectively, both of the first and second magnetoresistive effect elements are increased in dRA with a decrease in distance between a pinning layer and a free layer. Therefore, as shown in example 2 described later, ti2 is reduced compared with ti1 within a range of 2.0 nm≥ti1-ti2≥0.2 nm, and thereby a difference between dRA1 and dRA2 may be reduced. In the case that dRA1 and dRA2 are controlled by controlling the thickness ti1 and the thickness ti2 in this way, since the difference between dRA1 and dRA2 is originally decreased compared with the situation where ti1=ti2 is used, a thickness tp1 and a thickness tp2, at which dRA1=dRA2 is established; are still within the range of 2.0 nm≥tp2-tp1 shown in the example.

According to the above, a differential magnetoresistive effect element, in which dRA1=dRA2, can be achieved by adjusting the element such that 2.0 nm≥tp2-tp1≥0.2 nm, according to some embodiments.

According to another example (Example 2), a configuration example of the invention is shown, in one approach. A stacking order of a differential magnetoresistive effect element is the same as the configuration shown in the Example 1. However, the example is different from Example 1 in that a total thickness tp1 of continuous ferromagnetic layers adjacent to the first intermediate layer 7 among ferromagnetic layers forming the first pinning layer 6 is 3 nm. In addition, a total thickness tp2 of continuous ferromagnetic layers adjacent to the second intermediate layer 11 among ferromagnetic layers forming the second pinning layer 12 is 3 nm. It is assumed in Example 2 that a thickness of the first intermediate layer is ti1, and a thickness of the second intermediate layer is ti2 (ti1 and ti2 are variables).

Figure 7:
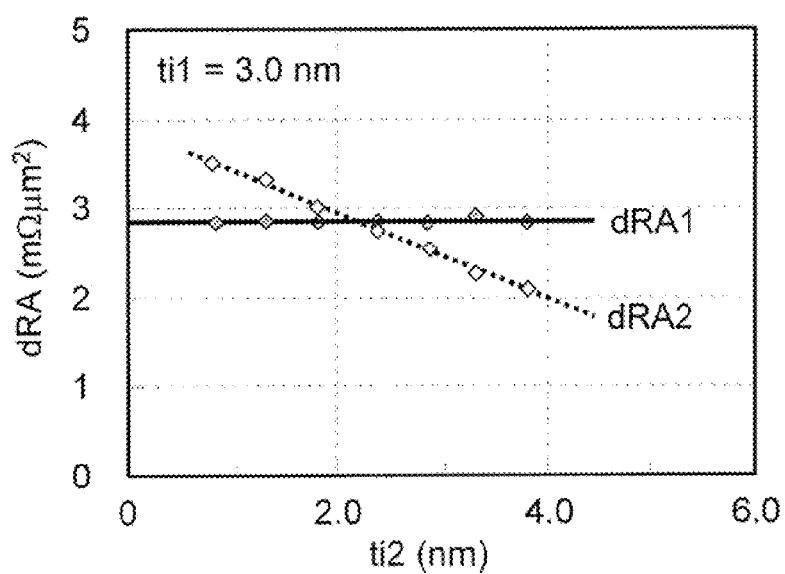
FIG. 7 is a diagram showing $ti2$ dependence of $dRA2$, according to one embodiment.

FIG. 7 shows dRA1 and dRA2 in a situation where the thickness ti1 of the first intermediate layer is 3 nm, and the thickness ti2 of the second intermediate layer 11 is plotted in abscissa.

From FIG. 7, when ti1=ti2=3 nm, a difference between dRA1 and dRA2 is 0.4 mΩμm². This corresponds to a reduction in output due to degradation in crystallinity of the second magnetoresistive effect element. When the thickness ti2 is gradually decreased, only dRA2 is increased, and dRA1 is not affected. It is known from this that the thickness ti2 is controlled, and thereby dRA2 can be controlled independently of dRA1. When ti1 is fixed to 3 dRA1=dRA2 in the situation where ti2 is 2.3 nm.

Figure 8:
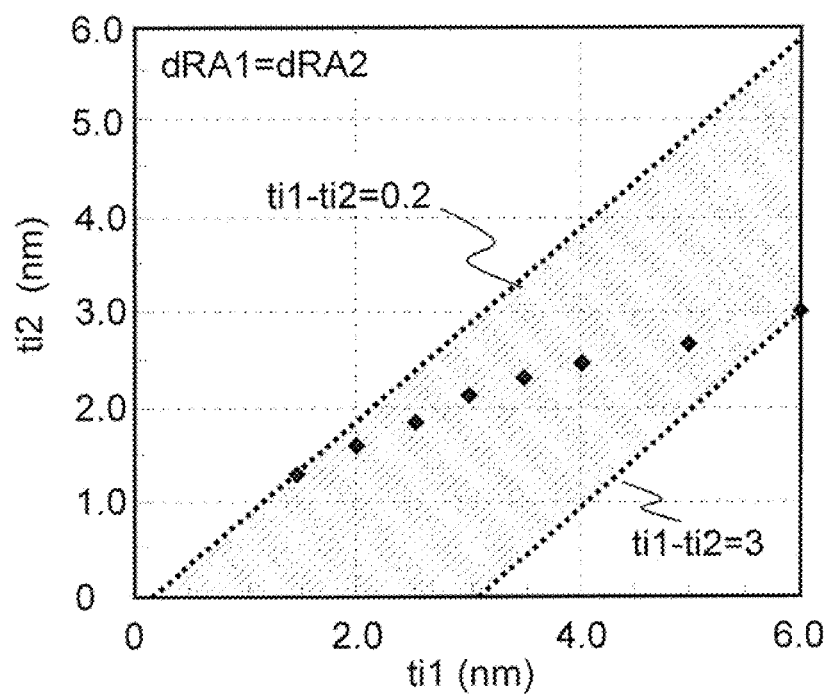
FIG. 8 is a diagram showing a combination of $ti1$ and $ti2$ where $dRA1=dRA2$, according to one embodiment.

Next, FIG. 8 shows a thickness ti2 at which dRA1=dRA2 when thickness ti1 is in a range of about 1.5 nm to about 6 nm. It can be seen from FIG. 8 that the thickness ti2 at which dRA1=dRA2 is within a range of 3.0 nm≥ti1-ti2≥0.2 nm.

Here, the lower limit of ti1, 1.5 nm, is a lower limit of a thickness of the intermediate layer for preventing strong magnetic coupling of the pinning layer to the free layer. Since dRA is decreased with an increase in ti1, the upper limit, 6 nm, is an upper limit thickness below which sufficient output as a sensor can be obtained.

In Example 2, tp1=tp2=3.0 nm was used as a thickness of the respective pinning layers. However, when the thickness tp1 and the thickness tp2 are changed, both of the first and second magnetoresistive effect elements are increased in dRA, respectively, with an increase in thickness of a pinning layer. Therefore, as shown in Example 1 described above, tp2 is increased compared with tp1 within a range of 2.0 nm≥tp2-tp1≥0.2 nm, and thereby a difference between dRA1 and dRA2 may be reduced. In the situation where dRA1 and dRA2 are controlled by controlling the thickness tp1 and the thickness tp2 in this way, since the difference between dRA1 and dRA2 is originally decreased compared with the situation where tp1=tp2 is used, thicknesses ti1 and ti2, at which dRA1=dRA2 are still within the range of 3.0 nm≥ti1-ti2 as shown in Example 2.

According to the descriptions above, a differential magnetoresistive effect element, in which dRA1=dRA2, can be achieved by designing the element such that 3.0 nm≥ti1-ti2≥0.2 nm, according to one approach.

Figure 9:
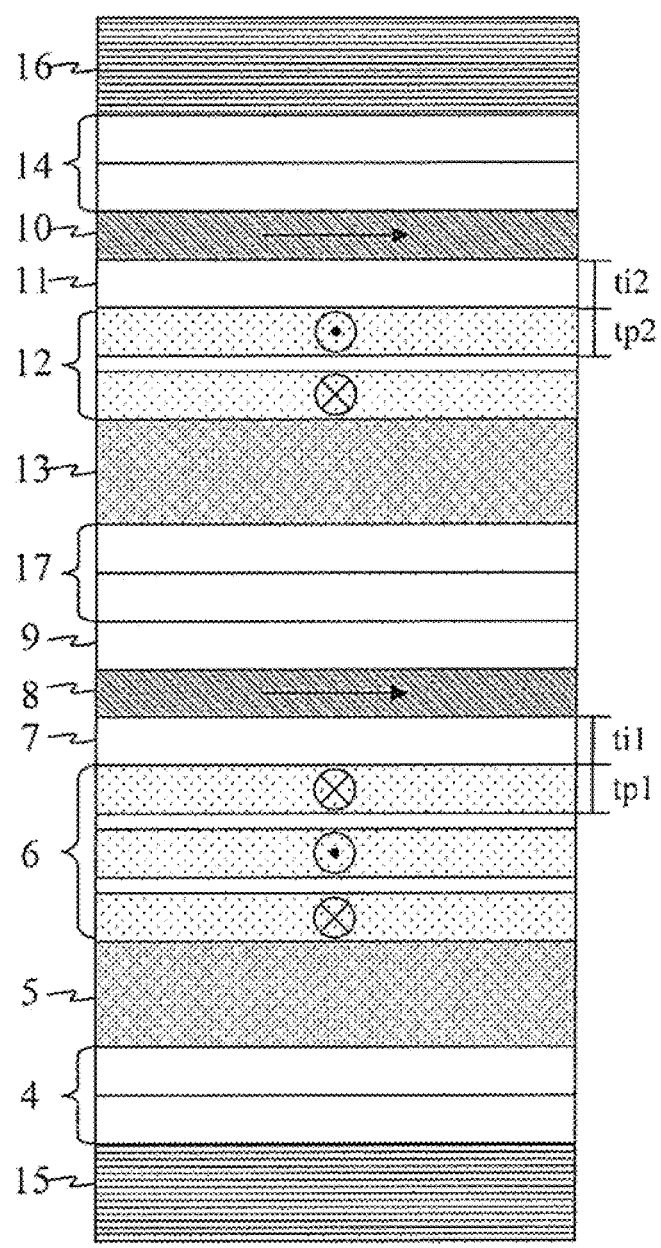
FIG. 9 is a schematic view as seen from an ABS side of a differential magnetoresistive effect element, according to one embodiment.

FIG. 9 shows a schematic view of a differential magnetoresistive effect element of the example as seen from an ABS side, according to one embodiment. Specifically, a first underlayer 4, a first antiferromagnetic layer 5, a first pinning layer 6, a first intermediate layer 7, a first free layer 8, a spacer layer 9, a second underlayer 17, a second anti ferromagnetic layer 13, a second pinning layer 12, a second intermediate layer 11, a second free layer 10, a cap 14, and an upper shield 16 are formed in order from a lower side on a lower shield 15. In such a configuration, thickness from the spacer layer 9 to the second intermediate layer 11 may be adjusted such that the thickness corresponds to a grain size of a medium. An optimum material may be selected for the second underlayer 17 for controlling crystal orientation of a film deposited thereon. In the example, a Ta (3 nm)/Ru (2 nm) multilayer film was used for the underlayer, but any appropriate material may be used. In addition, a single-layer film of Cu, Cr, Fe, Nb, Hf, Ni, Ta, Ru, NiFe, NiCr, NiFeCr, etc., or a multilayer film including any such material may be used.

The configuration has a characteristic where, since the first and second spin-valve-type magnetoresistive effect elements are produced in the same stacking order, crystal orientation of the second spin-valve-type magnetoresistive effect element is not affected by the thick spacer layer 9, unlike in Example 1, so that the crystal orientation of the second element is easily controlled, and therefore degradation in element property is relatively small.

Figure 10:
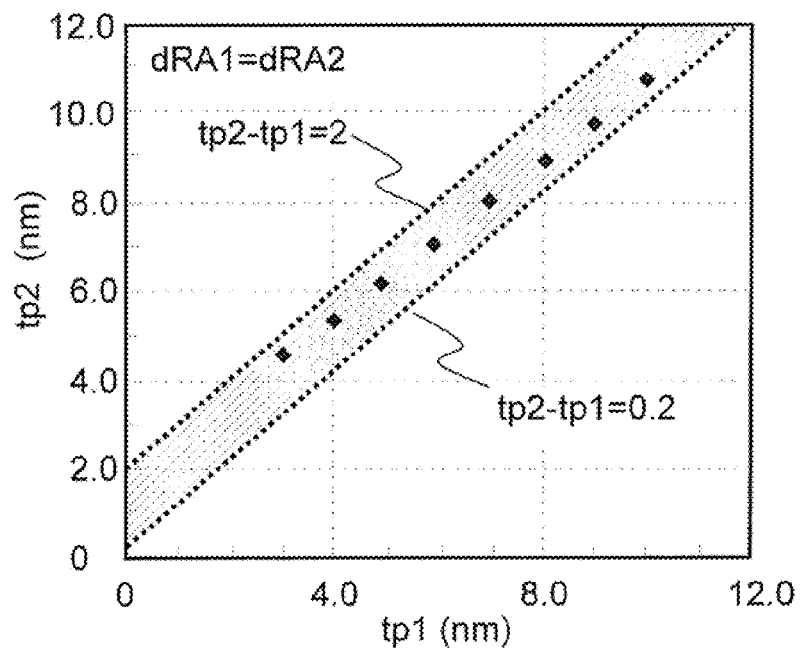
FIG. 10 is a diagram showing a combination of $tp1$ and $tp2$ where $dRA1=dRA2$, according to one embodiment.

FIG. 10 shows a relationship of tp1 and tp2 where dRA1=dRA2 is established in the configuration. Here, the lower limit of tp1, 3 nm, is a lower limit of thickness above which output of a magnetoresistive effect element is sufficiently secured. Typically, in a CPP-type magnetoresistive effect element, a spin bulk scattering effect is increased with an increase in thickness of a magnetic layer, and therefore output is increased until the thickness increases to a certain level. However, if thickness of the first pinning layer 6 is too large, pinning force of the pinning layer caused by the antiferromagnetic layer and the stacked ferromagnetic structure is reduced, so that magnetization in the pinning layer is easily moved in response to an external magnetic field. Therefore, an upper limit of tp1 is about 10 nm, according to some approaches.

It can be seen from FIG. 10 that the thickness tp2 at which dRA1=dRA2 is within a range of 1.5 nm≥tp2-tp1≥0.8 nm. The range is included within the range of 2.0 nm≥tp2-tp1≥0.2 nm shown in Example 1.

Figure 11:
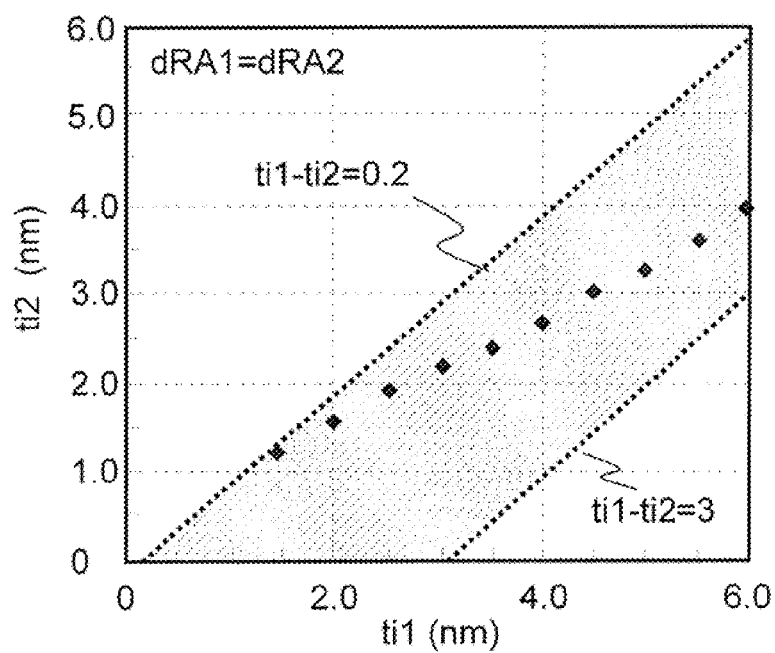
FIG. 11 is a diagram showing a combination of $ti1$ and $ti2$ where $dRA1=dRA2$, according to one embodiment.

FIG. 11 shows a relationship of ti1 and ti2 where dRA1=dRA2. Here, the lower limit of ti1, 1.5 nm, is a lower limit of thickness of the intermediate layer where strong magnetic coupling of the pinning layer to the free layer is effectively prevented. Since dRA is decreased with an increase in ti1, the upper limit, 6 nm, is an upper limit thickness below which sufficient output as a sensor can be observed.

It can be seen from FIG. 11 that the thickness ti2 at which dRA1=dRA2 is within a range of 2.0 nm≥ti1-ti2≥0.2 nm. The range is included within the range of 3.0 nm≥ti1-ti2≥0.2 nm shown in Example 1.

Figure 12:
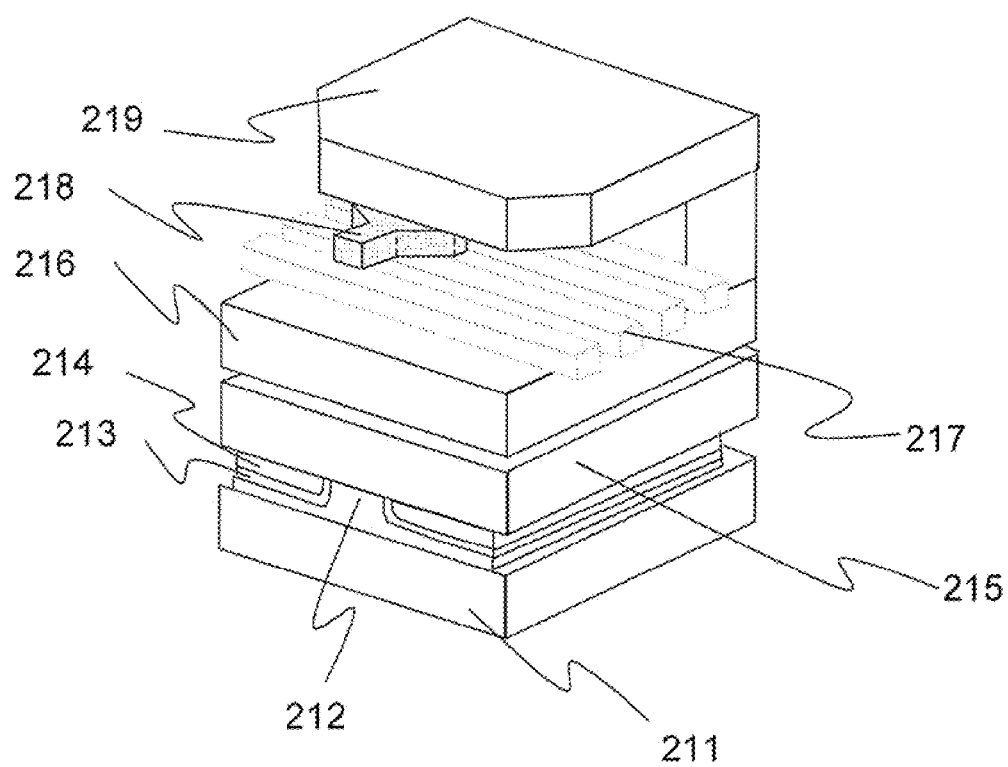
FIG. 12 is a schematic view of a recording/reading separated-type magnetic head for perpendicular recording, according to one embodiment.

FIG. 12 is a conceptual view of a recording/reading separated-type magnetic head for perpendicular recording, which is mounted with a magnetoresistive effect element according to one embodiment. A read head is comprised of a lower shield 211, a differential magnetoresistive effect element 212, an insulating gap film 213, a magnetic-domain control film 214, and an upper shield 215, each being formed above a substrate combined with a slider. A perpendicular recording head, which includes a sub pole 216, a coil 217, a main pole 218, and a yoke portion 219, is formed on an upper side of the read head.

This embodiment may be used regardless of whether a recording head is a perpendicular recording head or an in-plane recording head. However, the read head may exhibit more effective functions by using the read head in combination with the perpendicular recording head, according to some embodiments.

Figure 13:
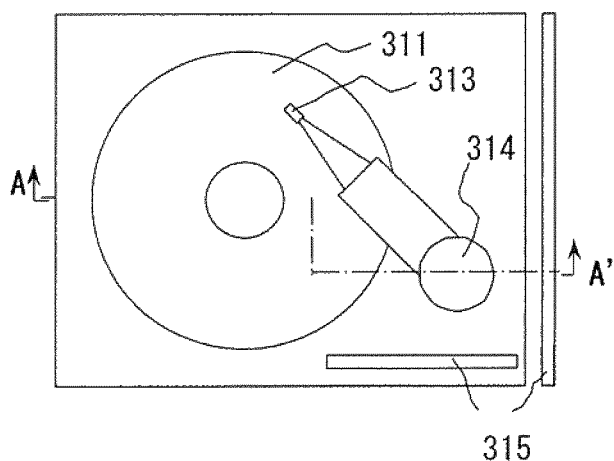
FIG. 13 is a schematic diagram of a magnetic disk drive, according to one embodiment.
Figure 13:
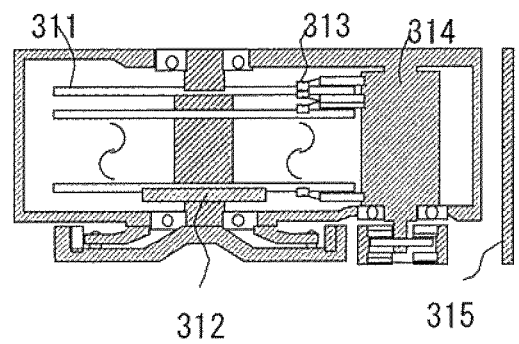

A magnetic disk drive using the recording/reading separated-type magnetic head for perpendicular recording produced in the previous example was produced. FIG. 13 is a schematic diagram of the magnetic disk drive, wherein FIG. 13(a) is a schematic plan diagram of the device, and FIG. 13(b) is a section diagram of the device along 'A-A' in FIG. 13(a). A granular medium for perpendicular recording including CoCrPt and $SiO_2$ was used for a magnetic recording medium 311 being magnetically written with information. The magnetic recording medium 311 is rotated by a spindle motor 312, and a head 313 is guided on a track of the recording medium 311 by an actuator 314. That is, in the magnetic disk drive, a read head and a recording head formed on the head 313 perform relative movement to the recording medium 311 near a predetermined recording position on the medium according to such a mechanism, and sequentially write and read a signal. A recording signal is recorded onto the medium by the recording head through a signal processing system 315, and output of the read head is obtained as a signal through the signal processing system 315.

For the above configuration, the magnetic head, according to some embodiments, and the magnetic recording/reading device mounted with the magnetic head were tested. As a result, sufficient output and an excellent bias characteristic were shown, and operation reliability was acceptable.

It should be noted that methodology presented herein for at least some of the various embodiments may be implemented, in whole or in part, in computer hardware, software, by hand, using specialty equipment, etc., and combinations thereof.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A differential magnetoresistive effect element comprising:
   a first magnetoresistive effect element having:
      a first pinning layer;
      a first intermediate layer; and
      a first free layer; and
   a second magnetoresistive effect element stacked above a spacer layer that is positioned above the first magnetoresistive effect element, the second magnetoresistive effect element having:
      a second pinning layer;
      a second intermediate layer; and
      a second free layer;
   wherein the first magnetoresistive effect element and the second magnetoresistive effect element show in-opposite-phase resistance change in response to a magnetic field in the same direction, and
   wherein tp2>tp1 is satisfied when a thickness of the first pinning layer is tp1, and a thickness of the second pinning layer is tp2,
   wherein the first pinning layer has more ferromagnetic layers than the second pinning layer.

2. The differential magnetoresistive effect element according to claim 1, wherein the first magnetoresistive effect element is physically characterized as having layers positioned in the following order: the first pinning layer, the first intermediate layer, and the first free layer from a substrate side, and wherein the second magnetoresistive effect element is physically characterized as having layers in the following order: the second free layer, the second intermediate layer, and the second pinning layer from a side closer to the spacer layer.

3. The differential magnetoresistive effect element according to claim 1, wherein the first magnetoresistive effect element is physically characterized as having layers in the following order: the first pinning layer, the first intermediate layer, and the first free layer in order from a substrate side, and the second magnetoresistive effect element is physically characterized as having layers in the following order the second pinning layer, the second intermediate layer, and the second free layer from a spacer layer side.

4. The differential magnetoresistive effect element according to claim 1, wherein the first magnetoresistive effect element and the second magnetoresistive effect element are CPP-GMR elements.

5. The differential magnetoresistive effect element according to claim 1, wherein tp2-tp1 is less than about 2.0 nm and greater than about 0.2 nm.

6. A magnetic head having a recording head and a read head, wherein the read head comprises the differential magnetoresistive effect element as recited in claim 1, wherein the second pinning layer is positioned between the first and second free layers.

7. A magnetic recording reading device, comprising:
a magnetic recording medium;
a medium drive section that drives the magnetic recording medium;
a magnetic head having:
a recording head;
a read head having the differential magnetoresistive effect element as recited in claim 1; and
a head drive section that positions the magnetic head onto a desired track of the magnetic recording medium.

8. A differential magnetoresistive effect element comprising:
a first magnetoresistive effect element having:
a first pinning layer;
a first intermediate layer; and
a first free layer; and
a second magnetoresistive effect element stacked via a spacer layer above the first magnetoresistive effect element, the second magnetoresistive effect element having:
a second pinning layer;
a second intermediate layer; and
a second free layer;
wherein the first magnetoresistive effect element and the second magnetoresistive effect element show in-opposite-phase resistance change in response to a magnetic field in the same direction, and
wherein ti2<ti1 when a thickness of the first intermediate layer is ti1, and a thickness of the second intermediate layer is ti2,
wherein the second pinning layer and the spacer layer are positioned between the first and second free layers.

9. The differential magnetoresistive effect element according to claim 8, wherein the first magnetoresistive effect element is physically characterized as having layers in the following order the first pinning layer, the first intermediate layer, and the first free layer from a substrate side, and wherein the second magnetoresistive effect element is physically characterized as having layers in the following order the second free layer, the second intermediate layer, and the second pinning layer from a spacer layer side wherein the first pinning layer has more ferromagnetic layers than the second pinning layer.

10. The differential magnetoresistive effect element according to claim 8, wherein the first magnetoresistive effect element is physically characterized as having layers in the following order the first pinning layer, the first intermediate layer, and the first free layer in order from a substrate side, and the second magnetoresistive effect element is physically characterized as having layers in the following order the second pinning layer, the second intermediate layer, and the second free layer from a spacer layer side.

11. The differential magnetoresistive effect element according to claim 8, wherein the first magnetoresistive effect element and the second magnetoresistive effect element are CPP-GMR elements.

12. A magnetic head having a recording head and a read head, wherein the read head comprises the differential magnetoresistive effect element according to claim 11, wherein the first pinning layer has more ferromagnetic layers than the second pinning layer.

13. A magnetic recording reading device, comprising:
a magnetic recording medium;
a medium drive section that drives the magnetic recording medium;
a magnetic head as recited in claim 12; and
a head drive section that positions the magnetic head onto a desired track of the magnetic recording medium.

14. A magnetic head having a recording head and a read head, wherein the read head comprises the differential magnetoresistive effect element as recited in claim 8.

15. A magnetic recording/reading device, comprising:
a magnetic recording medium;
a medium drive section that drives the magnetic recording medium;
a magnetic head having:
a recording head;
a read head having the differential magnetoresistive effect element as recited in claim 8; and
a head drive section that positions the magnetic head onto a desired track of the magnetic recording medium.

16. The differential magnetoresistive effect element according to claim 8, wherein ti1-ti2 is less than about 3.0 nm and greater than about 0.2 nm.

17. A magnetic recording/reading device, comprising:
a magnetic recording medium;
a medium drive section that drives the magnetic recording medium; and
a magnetic head, the magnetic head having:
a recording head;
a head drive section that positions the magnetic head onto a desired track of the magnetic recording medium; and
a read head, the read head including a differential magnetoresistive effect element, the differential magnetoresistive effect element comprising:
a first magnetoresistive effect element having:
a first pinning layer;
a first intermediate layer; and
a first free layer; and
a second magnetoresistive effect element stacked via a spacer layer above the first magnetoresistive effect element, the second magnetoresistive effect element having:
a second pinning layer;
a second intermediate layer; and
a second free layer;
wherein the first magnetoresistive effect element and the second magnetoresistive effect element show in-opposite-phase resistance change in response to a magnetic field in the same direction,
wherein the second pinning layer and the spacer layer are positioned between the first and second free layers,
wherein the first pinning layer has more ferromagnetic layers than the second pinning layer;
wherein $tp2>tp1$ is satisfied when a thickness of the first pinning layer is $tp1$, and a thickness of the second pinning layer is $tp2$.

18. The device according to claim 17, wherein $ti2<ti1$ when a thickness of the first intermediate layer is $ti1$, and a thickness of the second intermediate layer is $ti2$.

* * * * *